(12) United States Patent
Kobayashi et al.

(10) Patent No.: US 7,815,441 B2
(45) Date of Patent: Oct. 19, 2010

(54) RIGID-FLEXIBLE BOARD AND METHOD FOR MANUFACTURING THE SAME

(75) Inventors: Atsushi Kobayashi, Tokyo (JP); Kazuo Umeda, Tokyo (JP); Wataru Gotou, Tokyo (JP); Susumu Nakazawa, Tokyo (JP); Kiyoshi Takeuchi, Tokyo (JP); Takayuki Terauchi, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 258 days.

(21) Appl. No.: 11/547,690

(22) PCT Filed: Apr. 4, 2005

(86) PCT No.: PCT/JP2005/006590

§ 371 (c)(1),
(2), (4) Date: Jun. 22, 2007

(87) PCT Pub. No.: WO2005/099329

PCT Pub. Date: Oct. 20, 2005

(65) Prior Publication Data

US 2007/0281505 A1    Dec. 6, 2007

(30) Foreign Application Priority Data

Apr. 9, 2004  (JP) .......................... P2004-116265
Sep. 1, 2004  (JP) .......................... P2004-254851

(51) Int. Cl.
*H01R 12/00* (2006.01)

(52) U.S. Cl. ........................................ 439/67

(58) Field of Classification Search ............. 439/65, 439/74, 67; 174/250–254; 361/749–751, 361/792–795
See application file for complete search history.

(56) References Cited

U.S. PATENT DOCUMENTS 4,411,633 A * 10/1983 Waldron ...................... 445/24

(Continued)

FOREIGN PATENT DOCUMENTS

EP     0 647 090 A1    4/1995

(Continued)

OTHER PUBLICATIONS

Yamamoto, et al., "Printed wiring board and a method of manufacturing such printed wiring boards", Patent No. DE69419219D, published on Jul. 29, 1999.

(Continued)

*Primary Examiner*—Renee Luebke
*Assistant Examiner*—Larisa Tsukerman
(74) *Attorney, Agent, or Firm*—Finnegan, Henderson, Farabow, Garrett & Dunner, L.L.P.

(57) ABSTRACT

A rigid-flexible board and a method for manufacturing the same can be provided, whereby the material yield ratio can be enhanced and the productive yield can be also enhanced. A rigid board with a step for connection and a flexible board with a connector at the edge thereof are formed independently. Then, the connecting area is spot facing processed so that the depth of the thus obtained depressed portion is equal to or lower than the thickness of the flexible board. The connector of the flexible board is electrically connected to the vertical wiring area of the depressed portion.

16 Claims, 8 Drawing Sheets

U.S. PATENT DOCUMENTS

| | | | | |
|---|---|---|---|---|
| 5,219,292 | A | * | 6/1993 | Dickirson et al. ............ 439/67 |
| 5,219,293 | A | * | 6/1993 | Imamura .................... 439/67 |
| 5,736,681 | A | | 4/1998 | Yamamoto et al. |
| 5,865,934 | A | | 2/1999 | Yamamoto et al. |
| 5,990,417 | A | * | 11/1999 | Senda et al. ................ 174/391 |
| 6,050,829 | A | * | 4/2000 | Eldridge et al. .............. 439/67 |
| 6,191,838 | B1 | * | 2/2001 | Muramatsu ................ 349/149 |
| 6,444,923 | B1 | * | 9/2002 | Iriguchi et al. ............. 174/261 |
| 6,812,060 | B1 | * | 11/2004 | Kurita et al. ................ 438/106 |
| 6,974,333 | B2 | * | 12/2005 | Wildes et al. ................. 439/67 |
| 7,348,494 | B1 | * | 3/2008 | Handforth et al. .......... 174/260 |
| 2005/0126818 | A1 | * | 6/2005 | Kojima et al. .............. 174/255 |
| 2006/0281343 | A1 | * | 12/2006 | Uchida et al. ............... 439/67 |
| 2007/0007033 | A1 | * | 1/2007 | Das et al. .................... 174/257 |
| 2008/0289859 | A1 | * | 11/2008 | Mikado et al. ............. 174/254 |
| 2009/0283301 | A1 | * | 11/2009 | Takahashi .................. 174/254 |
| 2010/0025087 | A1 | * | 2/2010 | Takahashi .................. 174/254 |

FOREIGN PATENT DOCUMENTS

| | | |
|---|---|---|
| JP | 5-75270 | 3/1993 |
| JP | 7-86749 | 3/1995 |
| JP | 8-204332 | 8/1996 |
| JP | 2000-059032 A | 2/2000 |
| JP | 2000-077810 A | 3/2000 |
| JP | 2000-299556 | 10/2000 |
| JP | 2001-24292 | 1/2001 |
| JP | 2002-64271 | 2/2002 |
| JP | 2003-124625 | 4/2003 |

OTHER PUBLICATIONS

Yamamoto, et al., "Printed wiring board and a method of manufacturing such printed wiring boards", Patent No. DE69419219T, published on Jan. 5, 2000.

International Preliminary Report on Patentability and Written Opinion issued by the International Bureau of WIPO on Oct. 19, 2006, for International Patent Application No. PCT/JP2005/006590.

Office Action issued by the Chinese Patent Office on Mar. 13, 2009, for Chinese Patent Application No. 200580010261.0, and English-language translation thereof.

Office Action issued by the Japanese Patent Office on Jan. 26, 2010, for Japanese Patent Application No. 2004-254851 (3 pages), and English-language summary of the Office Action (1 page).

* cited by examiner

RIGID-FLEXIBLE BOARD AND METHOD FOR MANUFACTURING THE SAME

TECHNICAL FIELD

The present invention relates to a method for manufacturing a rigid-flexible board, particularly comprising a plurality of rigid boards which are connected to a flexible board so that the main surface level of the flexible board is equal to or lower than the main surface levels of the rigid board.

BACKGROUND ART

In disposing a rigid board over a bending portion of a steel case, generally, the rigid board is divided into a plurality of pieces which are to be connected with one another by utilizing connectors or a flexible board.

In the connecting the rigid board pieces with the connectors or the flexible board, however, the thickness of the thus obtained assembly is increased by the thickness of the connectors or the flexible board so as to prevent the thinning of the intended instrument. Moreover, after the rigid board pieces are connected with the connectors or the flexible board, the same treatment and processing can not be carried out for the rigid board pieces, resulting in the deterioration of productivity.

In this point of view, such a rigid-flexible board as the rigid board pieces with the same thickness is connected to the flexible board so that the main surface levels of the flexible board is equal to or lower than the main surface level of the rigid board pieces.

The rigid-flexible board can be manufactured as disclosed in Japanese Patent Application Laid-open No. 7-86749 wherein a conductive metal plate made of electrolytic copper foil on which conical shaped conductive bumps are formed through hardening so as to protrude thereon and oppose to another conductive metal plate via a thermal melting sheet made of synthetic resin, and then, the conductive metal plates are combined under thermal pressing so as to form a two-sided board. However, such a manufacturing method requires many steps as follows (see, Patent document No. 1). Herein, the same reference numerals are imparted to like components throughout figures, so that the description for like components is omitted.

Figure 17:
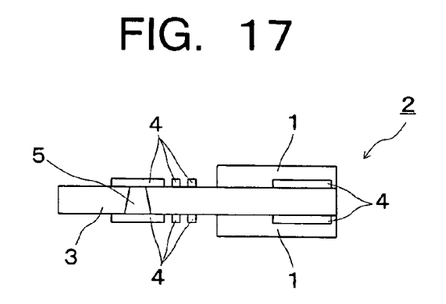
FIG. 17 is a cross sectional view schematically illustrating a flexible board to be used in the manufacture of a conventional rigid-flexible board.

Such a conventional technique will be described hereinafter with reference to FIGS. 17-23. In the conventional technique, first of all, as illustrated in FIG. 17, a two-sided flexible board 2 is formed so that the edge portions are not covered with a cover film 1. The not covered area of the flexible board 2 with the cover film 1 is laminated on a rigid board. In FIG. 17, the reference numeral "3" designates a liquid crystal polymer film, and the reference numeral "4" designates a horizontal wiring area (conductive pattern), and reference numeral "5" designates a vertical wiring area (conductive bump).

The vertical wiring area 5 can be formed using the conductive bump as follows. First of all, the conical conductive bump is formed on an electrolytic copper foil to be the horizontal wiring area 5 through patterning as post-process, and the conductive bump is opposed to another electrolytic copper foil via the liquid polymer film (synthetic resin sheet) 3. The electrolytic copper foils are combined through thermal pressing. In this case, the forefront of the bump is pressed against the electrolytic copper foil so as to be plastic-deformed into a circular cone shape as functioning as the vertical wiring area 5 to connect the horizontal wiring areas 4. The horizontal wiring areas 4 can be formed by applying resist on the electrolytic copper foils, exposing the resist through a mask pattern, removing the unexposed area through developing and etching the exposed area of the electrolytic copper foils.

The cover film 1 can be formed by applying resist on the electrolytic copper foils after etching and removing the area to be combined with the rigid board through photolithography.

Figure 18:
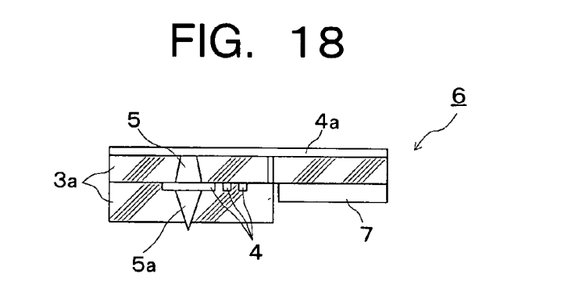
FIG. 18 is a cross sectional view schematically illustrating a laminated body to be laminated with the flexible board illustrated in FIG. 17.
Figure 19:
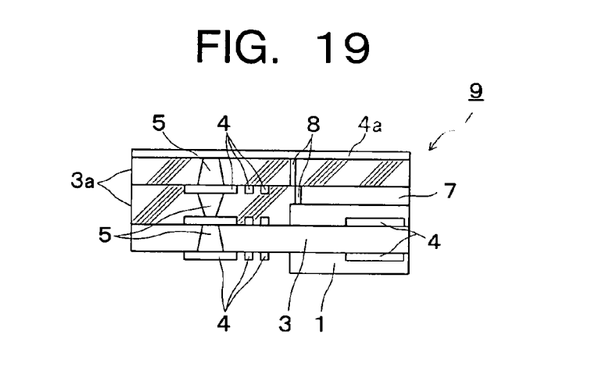
FIG. 19 is a cross sectional view schematically illustrating the laminated body wherein the flexible board as illustrated in FIG. 17 is laminated on the laminated body illustrated in FIG. 16.

As illustrated in FIG. 18, the flexible board 2 is combined with a laminated body 6 (the reference numeral "7" designates a releasing film) with a conductive bump 5a which is made in another forming process so as to be a laminated body 9 as illustrated in FIG. 19.

The laminated body 6 can be formed as follows. A conical conductive bump is formed in an electrolytic copper foil to be the horizontal wiring area 4 after etching as post-process, and the electrolytic copper film is combined with another electrolytic copper film 4a via a glass-epoxy based prepreg (synthetic resin based sheet) 3a so that the conical conductive bump is opposed to the electrolytic copper foil 4a. In this case, the forefront of the conductive bump is pressed against the electrolytic copper foil 4a so that the forefront of the conductive bump is plastic-deformed into a circular cone shape as functioning as the vertical wiring area 5 to connect the electrolytic copper foils 4a. Then, one of the electrolytic copper foil is patterned into the horizontal wiring area 4. Then, a conductive bump 5a is formed at the position of the horizontal wiring area 4 corresponding to the vertical wiring area 5, and a synthetic resin sheet 3a is formed so that the forefront of the conductive bump 5a protrudes through and is combined with the sheet 3a.

The combination between the laminated body 6 and the flexible board 2 is performed by aligning the side wherein the conductive bump 5a protrudes for the exposed surface area (not covered area with the cover film 1) of the horizontal wiring area 4 of the flexible board 2, and performing thermal pressing (FIG. 19). In this case, a slit 8 is formed at the interface between the laminated body 6 and the flexible board 2, and a releasing film 7 as functioning as a spacer is formed on the surface of the flexible board 2 opposing to the cover film 1.

Figure 20:
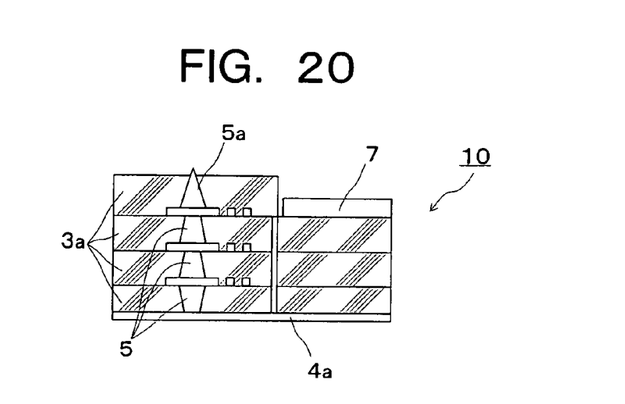
FIG. 20 is a cross sectional view schematically illustrating the laminated body as illustrated in FIG. 19 and a laminated body to be laminated with the laminated body illustrated in FIG. 19.
Figure 21:
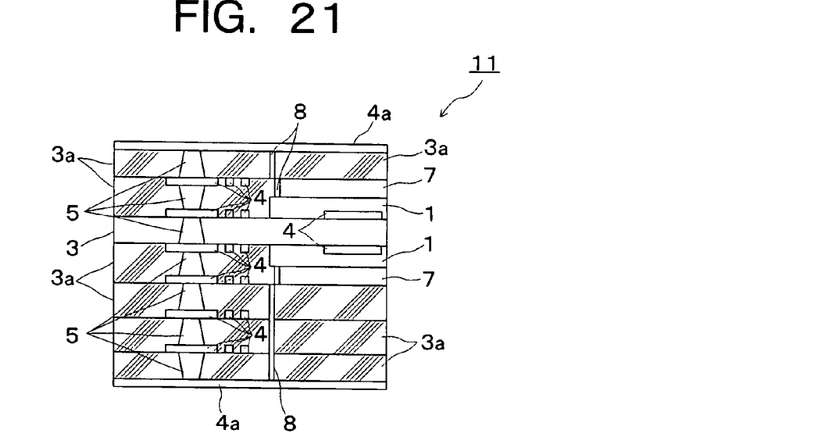
FIG. 21 is a cross sectional view schematically illustrating the laminated body wherein the laminated body illustrated in FIG. 19 is laminated with the laminated body illustrated in FIG. 20.

As illustrated in FIG. 20, the laminated body 9 is combined with a laminated body 10 made in another processing through thermal pressing so that the flexible board 2 is contacted with the laminated body 10. In this way, a laminated body 11 is formed (FIG. 21).

The combination between the laminated body 9 and the laminated body 10 is performed as follows. First of all, the conductive bump 5a protruding from on the laminated body 10 is contacted with the horizontal wiring area 4 of the laminated body 9 (flexible board 2). Then, the releasing film 7 as functioning as a spacer is formed on the surface of the laminated body (flexible board) 2 opposing to the cover film 1. Then, the laminated body 10 is laminated on the laminated body 9 so as to form a laminated body 11 with eight horizontal wiring areas 4 through thermal pressing as illustrated in FIG. 21.

Figure 22:
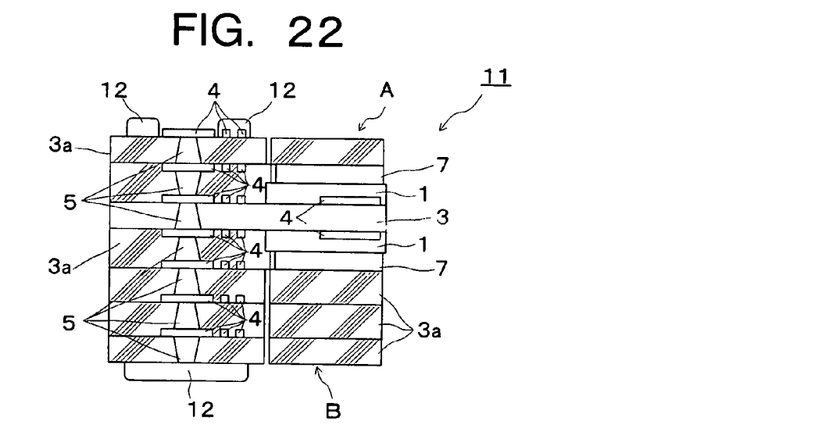
FIG. 22 is a cross sectional view schematically illustrating the laminated body wherein the outer layer of the laminated body illustrated in FIG. 21 is patterned.
Figure 23:
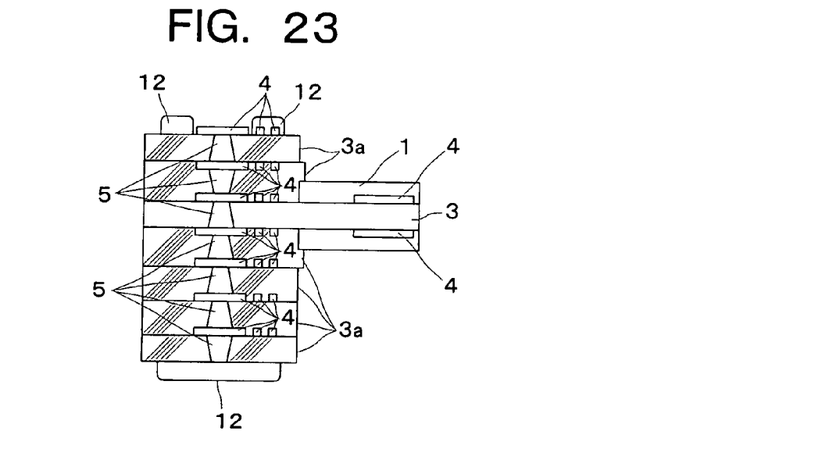
FIG. 23 is a cross sectional view schematically illustrating the rigid-flexible board.

Then, as illustrated in FIG. 22, the outer horizontal wiring (outer pattern) 4 is patterned, and insulating protective films 12 are formed of resist, and as illustrated in FIG. 23, the portions A and B covering the flexible board 2 are removed so as to form the intended rigid-flexible board.

Patent Document No. 1: Japanese Patent Application Laid-open No. 7-86749

SUMMARY OF THE INVENTION

As described above, in the conventional manufacturing method of rigid-flexible board, since the flexible board is formed between the adjacent rigid boards (particularly, the main surface level of the flexible board is substantially equal to or lower than the main surface level of the rigid board), complicated many processes are required.

Also, in the conventional manufacturing method, since a plurality of small board units are formed in the large board, a portion of the rigid board wherein the flexible board is to be formed is punched out, and a portion of the flexible board wherein the rigid board is to be formed is punched out. In this case, much waste is created from the punched out portions so that the yield ratio of the boards is deteriorated.

Then, since a plurality of rigid-flexible board units are formed in the large board, if one of the synthetic resin sheets or one of the rigid-flexible board units is failed, all of the rigid-flexible board units are failed so that high productive yield can not be obtained.

In order to iron out the above-mentioned problem, this invention relates to a rigid-flexible board comprising a rigid board with a step for connection, and a flexible board connected with the rigid board at the step. In this case, the flexible board is connected with the rigid board only at the step so that the flexible board does not exist at any area except the step.

In one aspect of the present invention, a connector is formed so as to be exposed from the top surface of the step so that the rigid board is electrically connected with the flexible board by the connection between the connector of the rigid board and another connector of the flexible board.

The connector of the rigid board is electrically connected to a horizontal wiring area of said rigid connector which is positioned below said connector via a plated metal layer and/or a hardened conductive paste.

The rigid board may include a detecting terminal at the lower surface, and the connector at the step of the rigid board may be made of a plated metal layer and/or a hardened conductive paste (paste-like conductive compound).

The connector of the flexible board is made of a metal wiring, plated metal layer and/or hardened conductive paste.

The vertical wiring area to which the connector of the rigid board is connected can be made by forming a conductive bump through the board or a via hole, through hole. The connector of the flexible board to be connected with the connector of the rigid board can be made of a conductive bump or another material such as high temperature solder, electrolytic copper foil, plated metal layer.

The connector of the rigid board is electrically connected with the connector of the flexible board through the pressure bonding of a conductive paste, an anisotropy conductive film, a high temperature solder, plated Au films which are formed on both connectors, or a bump made of a hardened conductive material or a conductive metal.

The conductive bump to be used as the vertical wiring area of the rigid board and the flexible board, and the connector of the flexible board is normally formed on the conductive metal layer. As the conductive metal layer, a conductive sheet such as electrolytic copper foil can be exemplified. The conductive sheet can be used by itself and patterned in a given shape. The shape of the conductive layer is not restricted. The conductive bump may be formed on one side or both sides. The conductive bump is made from conductive powders such as Ag, Au, Cu, solder powders, metallic alloy powders thereof or complex (mixed) metallic powders thereof, and a binder (e.g., polycarbonate resin, polysulfone resin, polyester resin, phenoxy resin, phenol resin, polyimide resin). As a result, the conductive bump is made from the conductive compound or conductive metal thereof. In the formation of the conductive bump from the conductive compound, the aspect ratio of the conductive bump can be increased by means of printing using a thicker metal mask. The height of the bump is generally set within a range of 100-400 μm. Moreover, the height of the bump can be determined in view of one synthetic resin sheet or some synthetic resin sheet. The conductive bump can be made of the conductive metal as follows. (a) Small metallic clusters with the same size or shape are dispersed on the conductive metal layer with an adhesive layer and selectively adhered (in this case, a mask may be used). (b) A plated resist is printed and patterned on the electrolytic copper foil and such a material as Cu, Sn, Au, Ag, solder is plated over the patterned resist to selectively form the small metallic column (bump). (c) A solder resist is coated and patterned on the conductive metal layer and the conductive metal layer with the patterned solder resist is immersed-into a soldering bath to form a small metallic column (bump). (d) A resist is formed so as to partially cover the metal plate to form a small metallic column (bump) through etching. Herein, the small metallic clusters and the small metallic column corresponding to the bump can be formed in a multilayered structure made of different materials or a multilayered shell structure. For example, an Au or Ag layer is coated on the Cu core so as to apply anti-oxidization characteristic to the bump. Also, a solder layer is coated on the Cu core so as to apply soldering connection to the bump. In the present invention, if the conductive bump is made from the conductive compound, the forming process of the bump can be simplified in comparison with the forming process using plating. Therefore, the manufacturing cost of the rigid-flexible board can be lowered.

As the synthetic resin sheet constituting the insulating layer of the rigid board and the flexible board through which the conductive bump is penetrated, a thermoplastic resin film (sheet) or a thermosetting resin sheet which is maintained under not-hardening. As the thermoplastic resin, polycarbonate resin, polysulfone resin, thermoplastic polyimide resin, polyethyrene tetrafluoride, polypropylene hexafluoride, polyetherketone resin can be exemplified. As the thermosetting resin, epoxy resin, bismaleimide triazine resin, polyimide resin, phenol resin, polyester resin, melamine resin, butadiene rubber, butyl rubber, natural rubber, neoprene rubber, silicone rubber can be exemplified. The synthetic resin may include insulating inorganic material or insulating organic material. Also, the synthetic resin may include glass cloth or mat, organic synthetic cloth or mat, or paper as reinforcing material.

In the present invention, when the synthetic resin sheets are applied on the conductive metal layers with the conductive bumps to form a plurality of laminated bodies, which are combined through heating and pressing, as the base (supporting member) for the synthetic resin sheets, a metal plate or a synthetic resin sheet-with lower size variation and lower deformation such as stainless steel, brass steel, polyimide resin plate (sheet) or polytetrafluoroethyrene resin plate (sheet) can be used.

According to the rigid-flexible board of the present invention, the rigid board and the flexible board are made independently and then, combined with one another. Therefore, the intended rigid-flexible board can be easily made. In this point of view, the manufacturing process for the rigid-flexible board can be simplified remarkably. Then, the rigid board and the flexible board can be formed into the finally desired shapes before the combination. Therefore, the connecting area of the rigid board may not be punched out previously and the connecting area of the flexible board may not be punched out previously so that the material yield efficiency can be enhanced through the lowering the waste material. Then, since the rigid board and the flexible board can be detected in defect under the condition of the finally desired shapes, the material loss relating to the boards can be lowered even though some defects are detected during the formation process of the boards.

In the present invention, the rigid board includes a step for connecting the rigid board with the flexible board. In this case, since the flexible board is connected to the rigid board via the step, the main surface level of the flexible board can be substantially equal to or lower than the main surface level of the rigid board so that the main surface of the flexible board can not disturb the component mounting process. In the case of screen-printing solder cream onto a component mounting surface, if the main surface level of the flexible board is higher than the main surface level of the rigid board, the screening surface for printing is contacted with the flexible board and thus, not contacted with the rigid board. Therefore, the screen printing can not be performed under good condition. If the main surface level of the flexible board is equal to or lower than the main surface level of the rigid board, the above-mentioned disadvantage can be removed. Normally, however, if the solder resist film is formed in a thickness of 20-50 μm on the rigid board, the screen printing can be carried out without the above-mentioned disadvantage. Moreover, if the solder resist is formed apart from the solder cream printing pattern, the solder resist film with even a thickness of 100 μm can not disturb the above-mentioned screen printing. Herein the phrase of "the main surface level of the flexible board being equal to or lower than the main surface level of the rigid board" means that the screen printing can be performed not subject to the solder resist film, and thus, can be defined normally as 100 μm or below, preferably as 50 μm or below.

EXPLANATION FOR REFERENCES

1 . . . covering film; 2 . . . two-sided flexible board not covered with covering film 1; 3 . . . polyimide film; 3a . . . glass-epoxy based prepreg (synthetic resin sheet); 4 . . . horizontal wiring area (conductive pattern); 4a . . . electrolytic copper foil; 5 . . . vertical wiring area (conductive bump); 5a . . . conductive bump; 6, 9, 10, 11 . . . laminated body; 8 . . . slit; 12 . . . insulating protective film; 20, 21 . . . flexible board; 23 . . . rigid board; 24 . . . frame; 25 . . . small protrusion; 26 . . . protrusion; 27 . . . depressed portion; 28 . . . via hole; 29 . . . conductive bump made by high temperature soldering; TH . . . through-hole

BEST MODE FOR IMPLEMENTING THE INVENTION

An embodiment according to the present invention will be described with reference to the FIGS. 1-16. In this case, the same references are imparted to like components through FIGS. 1-16 and 17-23 so that the explanation for like components will be omitted.

(Formation of Flexible Board)

First of all, electrolytic copper foils 4a with a thickness of 18 μm are applied on the both main surfaces of the polyimide film 3(PI) with a thickness of 25 μm to form a flexible board with copper foils on both of the main surfaces wherein through holes (TH) are formed at predetermined positions of the board.

Figure 1:
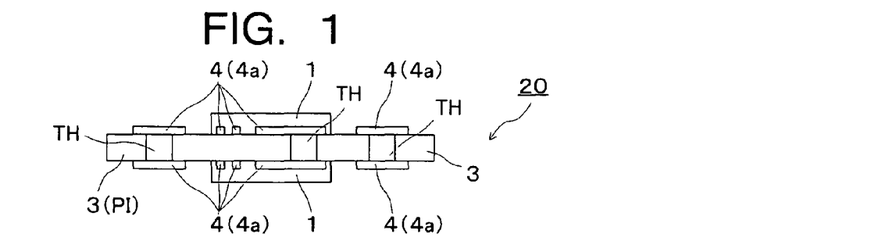
FIG. 1 is a cross sectional view schematically illustrating a two-sided flexible board to be used in the manufacture of a rigid-flexible board.

Then, a normal resist ink for etching (trade name: PSR-4000H made by Taiyo Ink Mfg Co., Ltd) is screen-printed on the electrolytic copper foils 4a of the flexible board. After the conductive patterned area is masked with resist, the electrolytic copper foils 4a are etched with an etching solution of copper chloride, and the resist mask is removed so as to form a two-sided flexible board 20 as illustrated in FIG. 1. The reference numeral "4" designates a horizontal wiring area formed by patterning the electrolytic copper foils 4a. Then, a covering film 1 is formed on the horizontal wiring area 4 except the area in the vicinity of the through holes TH of the two-sided flexible board 20.

Figure 2:
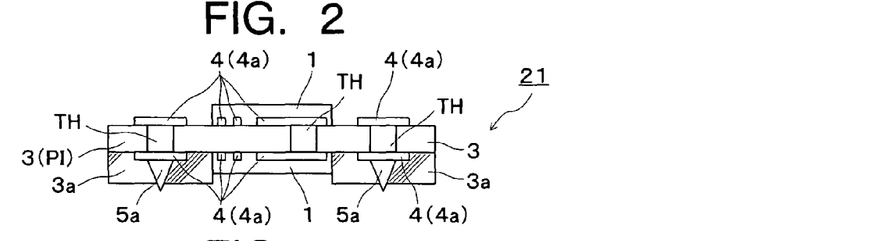
FIG. 2 is a cross sectional view schematically illustrating a state where conductive bumps are provided on the flexible board illustrated in FIG. 1.

Then, as illustrated in FIG. 2, conductive bumps 5a are formed so as to be connected with the through holes TH of the horizontal wiring area 4, and glass-epoxy based prepregs (synthetic resin sheets) are formed in a thickness of 60 μm on the horizontal wiring area 4. Then, the glass-epoxy based prepregs are disposed in between the heated plates kept at, e.g., 100° C. via aluminum foils or rubber sheets and pressed under a pressure of 1 MPa for one minute, thereby forming a flexible board 21 so that the forefronts of the conductive bumps 5a protrude from the top surfaces of the glass-epoxy based prepregs 3a (synthetic resin based sheets).

Figure 4:
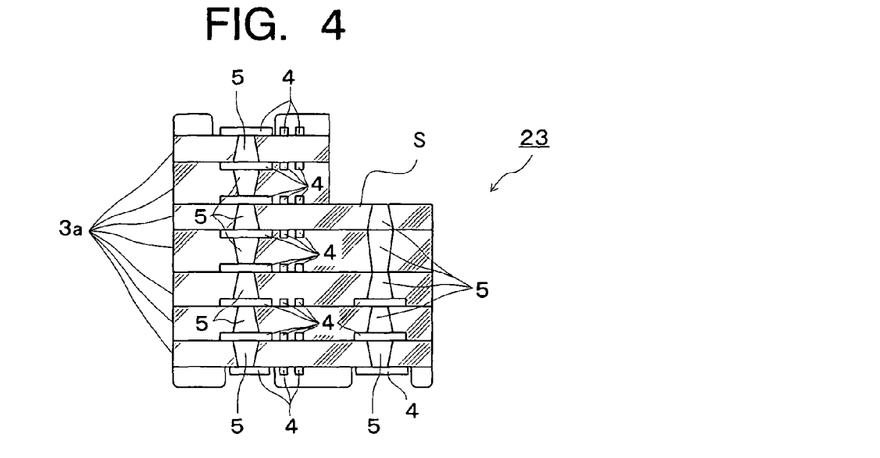
FIG. 4 is a cross sectional view schematically illustrating a state where spot facing process is carried out for the flexible board connecting area of the rigid board illustrated in FIG. 3.

Herein, the flexible board 21 as illustrated in FIG. 2 is utilized for connecting two rigid boards illustrated in FIG. 4. The flexible board 21 is configured such that many board units are formed in one large board, as illustrated in FIG. 2, and divided into flexible board pieces so as to be connected with the corresponding rigid boards.

(Formation of Rigid Board)

The intended rigid board can be formed in accordance with Japanese Patent Application Laid-open No. 8-204332 except that not hardened glass-epoxy based prepregs (synthetic resin based sheets) with a thickness of 60 μm are utilized instead of the polyimide film 3(PI). The forming method is known as B$^2$it (B-square-it: Trademark). In this case, the intended rigid board 22 is made from two sided rigid boards similar to the one illustrated in FIGS. 1 and 2 so as to include eight layered horizontal wiring area 4 as illustrated in FIG. 3.

The rigid board 22 has a similar structure to the one of the laminated body illustrated in FIG. 20 except that all of the insulating layers are made of glass-epoxy prepregs 3a (synthetic resin sheets).

Figure 3:
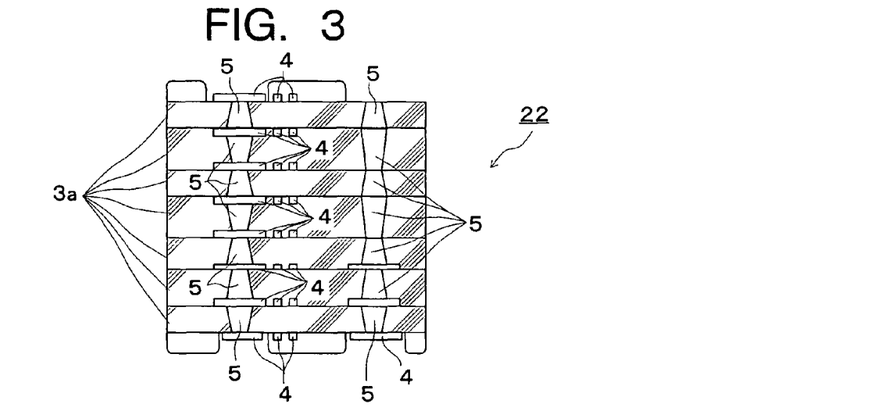
FIG. 3 is a cross sectional view schematically illustrating a rigid board to be used in the manufacture of the rigid-flexible board.

The flexible board 22 illustrated in FIG. 3 is configured such that many board units are formed in one large board, as illustrated in FIG. 2, and divided into rigid board pieces after the rigid board 22 is processed as illustrated in FIG. 3 or the spot facing process is carried out.

(Formation of Rigid-Flexible Board)

The spot facing process is carried out for the larger rigid board before division or the divided rigid board unit so that the processed depth is equal to or larger than the thickness of the flexible board 20 to be connected. In this way, the rigid board 23 with a step S to expose the vertical wiring area 5 as a connector is formed (FIG. 4).

Then, the rigid board units divided individually 23 are arranged for the flexible board units 21 divided individually in a frame so as to obtain the intended rigid-flexible board. The frame is configured such that a plurality of rigid-flexible boards are fabricated therein.

In this case, step S to expose the vertical wiring area 5 as the connector can be configured such that the horizontal wiring areas 4 can sandwich the vertical wiring area 5 as other components, but the horizontal wiring areas 4 can be removed as illustrated in FIGS. 3 and 4. The step S may be processed with a router before etching.

Figure 5:
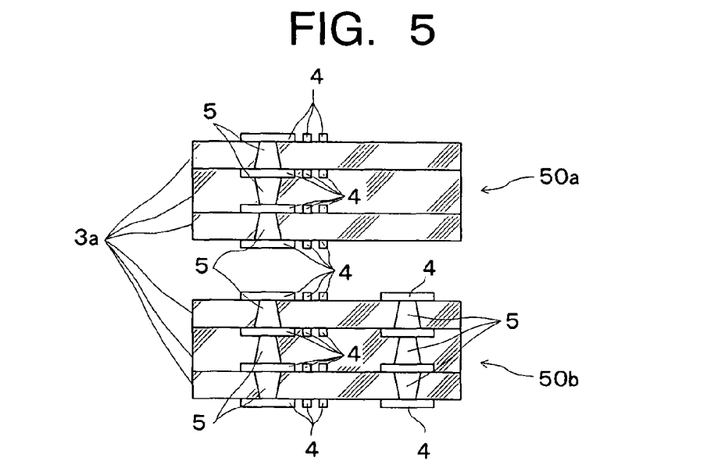
FIG. 5 is an explanatory view for manufacturing the rigid board with a step.
Figure 6:
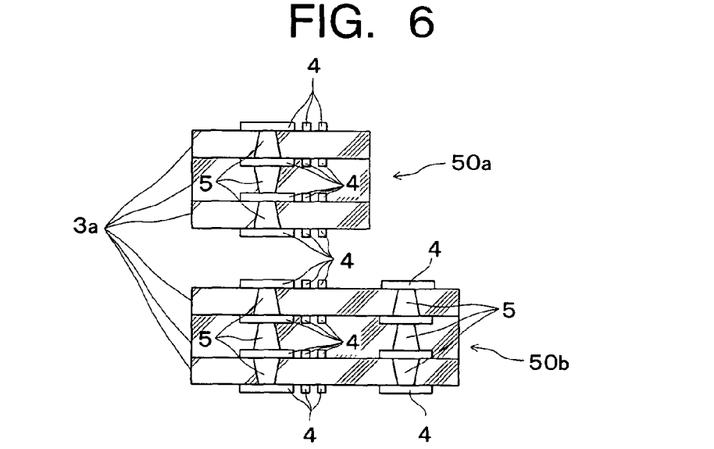
FIG. 6 is an explanatory view for manufacturing the rigid board with a step.
Figure 7:
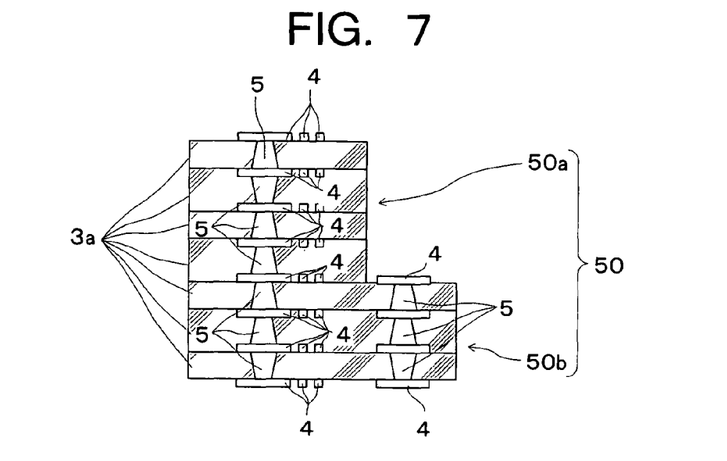
FIG. 7 is an explanatory view for manufacturing the rigid board with a step.

FIGS. 5-7 relate to another forming method of the rigid board with a step. In this embodiment, the upper laminated plate 50a, which is to be positioned above the step, is formed and the lower laminated plate 50b, which is to be positioned below the step, is formed, independently (FIG. 5). Then, the portion to be the step S of the laminated plate 50a is cut off (FIG. 6), and the laminated plate 50a with the step S is aligned for the laminated plate 50b, thereby forming the intended rigid board 50 with the step S through thermal pressing (FIG. 7). In this case, the horizontal wiring area 4 functions as a connector instead of the vertical wiring area 5 (FIGS. 5-7), but can be electrically and mechanically connected with the connector of the flexible board.

Figure 8:
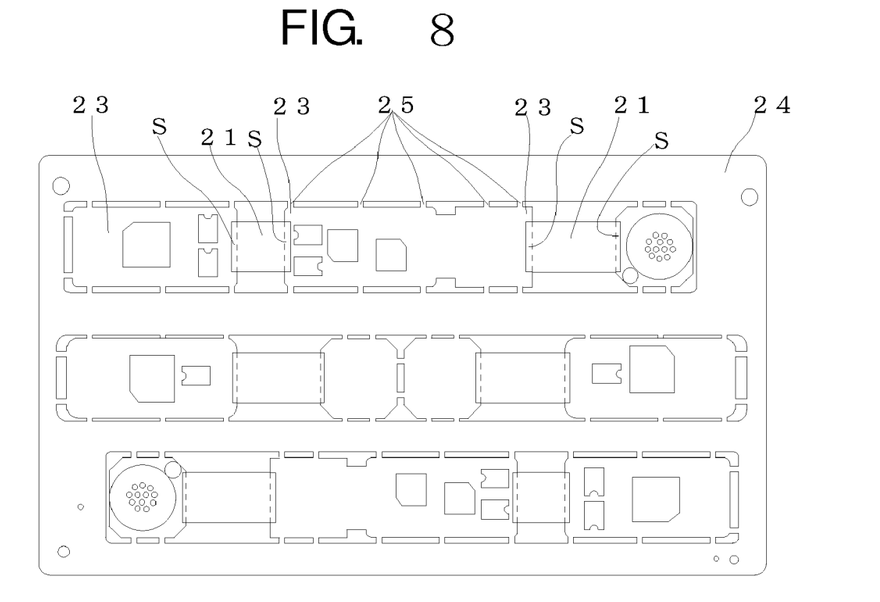
FIG. 8 is a plan view illustrating a state where a rigid board unit and a flexible board unit are built in a frame.

FIG. 8 shows the state where the rigid boards 23 with the steps S are aligned in the frame 24 so that the steps S of the rigid board 23 are opposed to one another and the flexible boards 21 are fixed tentatively over the steps S of the rigid boards 23. In this embodiment, small protrusions 25 are formed at the peripheries of the rigid boards 23 so that the space between the adjacent small protrusions is set equal to the space between the adjacent holders of the frame 24. Therefore, the rigid boards 23 are fixed at the frame 24 by inserting the protrusions 25 into the holders of the frame 24. In this case, the small protrusions 25 may be adhered to the inner wall of the frame 24 tentatively with adhesion.

Figure 9:
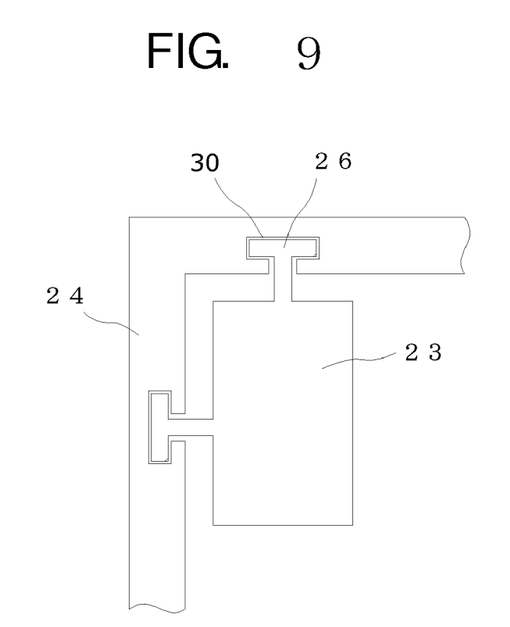
FIG. 9 is a plan view illustrating the engaged portion between the frame and the rigid board unit.

Then, as illustrated in FIG. 9, T-shaped protrusions 26 are provided at the edges of the rigid boards 23 so that the protrusions 26 can be engaged with depressed portions 27 provided at the inner wall of the frame 24.

Then, the frames 24 where the rigid boards 23 and the flexible boards 21 are aligned are prepared, and combined with one another through thermal pressing so that the intended rigid-flexible board can be obtained under the state where the rigid boards and the flexible boards are fixed in the frame 24.

Figure 10:
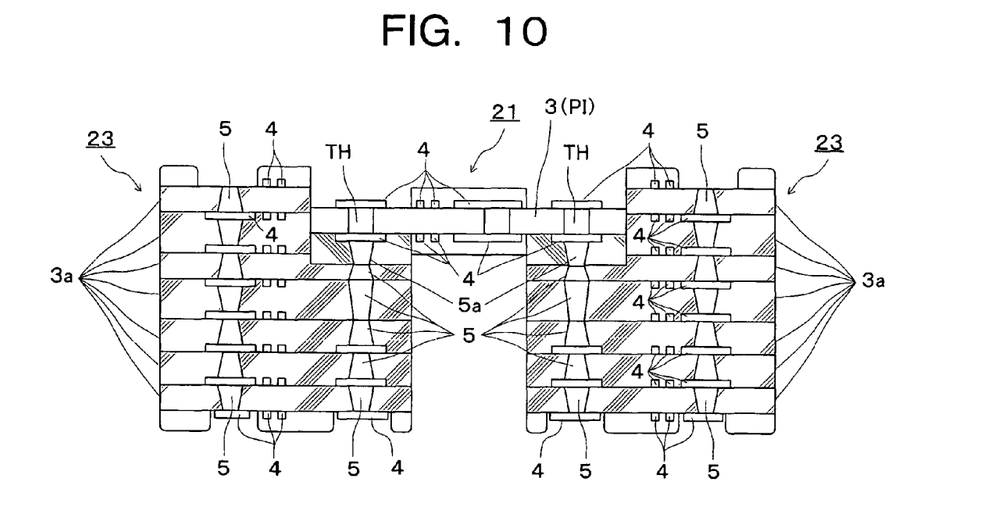
FIG. 10 is a cross sectional view illustrating a rigid-flexible board according to the present invention.

Then, the frame 24 is removed, thereby obtaining the intended final rigid-flexible circuit board as illustrated in FIG. 10.

In this embodiment, two rigid board is connected with one flexible board, but the numbers of the rigid board and the flexible board are not limited.

Figure 11:
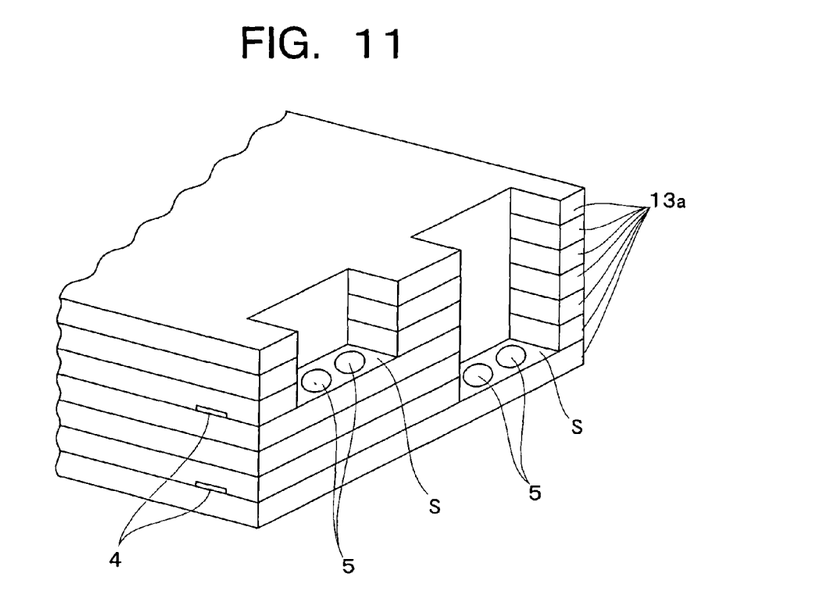
FIG. 11 is a perspective view illustrating the step provided at the rigid board.

Then, as illustrated in FIG. 11, a plurality of vertical wiring areas to be connected with the corresponding different horizontal wiring area are formed at one edge of one rigid board 23 so that the vertical wiring areas can be connected to the corresponding horizontal wiring area 4 through the steps with the respective different depths. Also, the vertical wiring areas are formed on the different edges of the rigid board so that the vertical wiring areas can be connected to the corresponding horizontal wiring area 4 through the steps.

Figure 12:
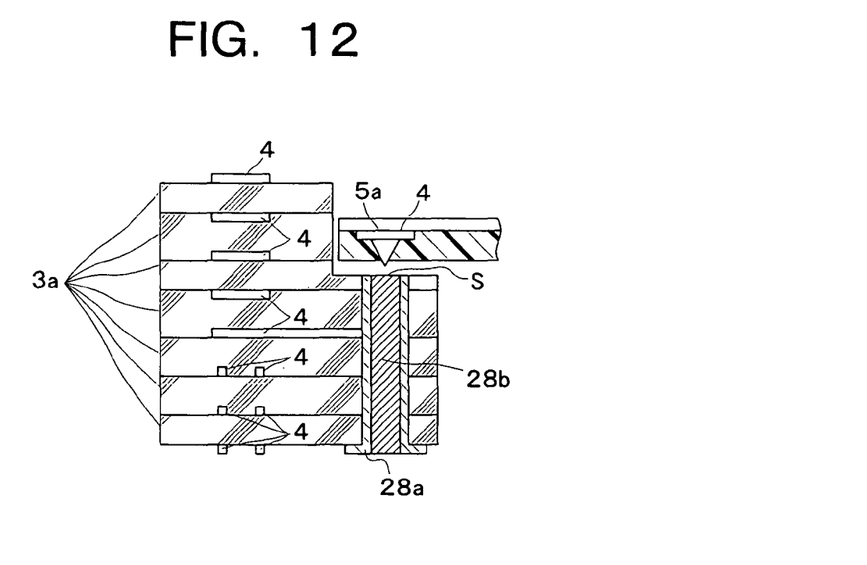
FIG. 12 is a cross sectional view schematically illustrating the connection between the rigid board and the flexible board.
Figure 13:
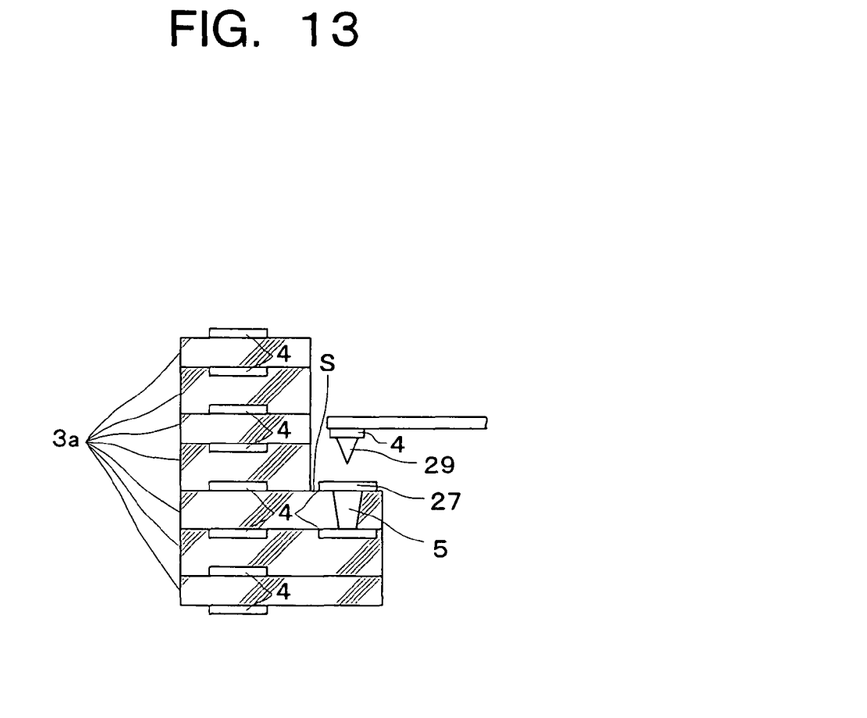
FIG. 13 is a cross sectional view schematically illustrating the connection between the rigid board and the flexible board.

In this embodiment, the vertical wiring area (connector) of the rigid board to which the flexible board is connected is made of the bump, but another constitution may be done. For example, as illustrated in FIG. 12, the vertical wiring area may be made by filling the conductive paste 28b into the via hole 28a. Then, as illustrated in FIG. 13, the conductive bump 29 is formed through high temperature soldering (within a temperature range of 200-240° C.) so as to be connected with the terminal 30 (substantially equal to the horizontal wiring area 4) formed on the step of the rigid board 23 through soldering. In this case, if the melting point of the solder to be used in electronic component mount is set lower than the melting point of the solder to be used in the rigid board-flexible board connection, the solder in the rigid board-flexible board connection cannot be melted again in the electronic component mount.

The connection between the flexible board and the rigid board may be carried out, e.g., (a) by bonding under pressure the flexible board and the rigid board via an anisotropy conductive film, (b) by performing Au plating for the terminals of the flexible board and the rigid board and bonding under pressure the plated Au films of the flexible board and the rigid board or (c) by thermally pressing under vacuum condition the flexible board and the rigid board via the conductive paste filled into the through hole of the insulating layer.

Figure 14:
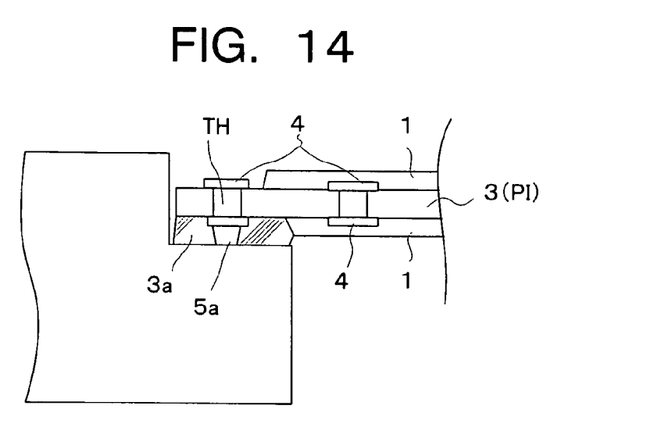
FIG. 14 is a cross sectional view schematically illustrating the connection between the rigid board and the flexible board.
Figure 15:
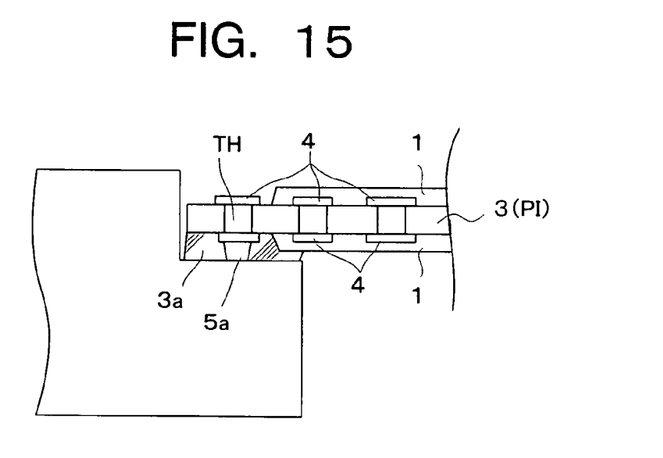
FIG. 15 is a cross sectional view schematically illustrating the connection between the rigid board and the flexible board.
Figure 16:
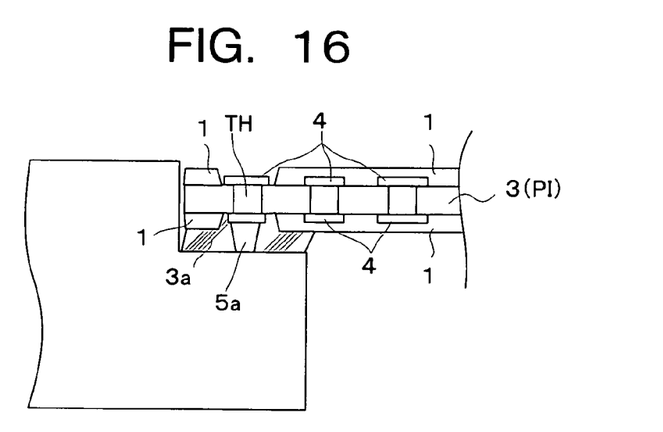
FIG. 16 is a cross sectional view schematically illustrating the connection between the rigid board and the flexible board.

In this embodiment, the covering film 1 is formed except the connecting area formed on both main surfaces of the flexible board for the rigid board (FIGS. 2 and 10), but another constitution may be done. A illustrated in FIGS. 14-16, the covering film 1 is formed over the connecting area. In FIG. 14, the thickness of the connecting area is not almost increased, but in FIGS. 15 and 16, the thickness of the connecting area is increased by the thickness of the covering film 1.

For example, the thickness of the polyimide resin (and the adhering layer) 3 functioning as the base of the flexible board is set within 12-90 μm, preferably within 25-50 μm. The thickness of the electrolytic copper foil functioning as the horizontal wiring area 4 is set within 9-35 μm, preferably within 12-18 μm. The thickness of the covering film 1 is set within 27-85 μm, preferably within 27-50 μm. The thickness of the prepreg 3a through which the conductive bump 5a is penetrated is set within 40-100 μm, preferably within 60-80 μm. Therefore, the thickness of the connecting area is set within 88-290 μm, preferably within 124-198 μm when the horizontal wiring area 4 and the covering film 1 are formed on either main surface of the flexible board, thereby constituting a one-sided flexible board. The thickness of the connecting area is set within 124-430 μm, preferably within 163-266 μm when the horizontal wiring area 4 and the covering film 1 are formed on either both main surfaces of the flexible board, thereby constituting a two-sided flexible board.

As described above, according to the present invention, in the manufacture of the rigid-flexible board, the rigid board and the flexible board are formed independently, and then, divided into the respective board units. Then, the intended rigid-flexible board can be formed by using the divided board units. In this point of view, material waste can be lowered so that the material yield ratio can be enhanced. In addition, since all of the board units are detected so that only the board units under good condition can be utilized to form the intended rigid-flexible board, material waste can be also lowered because only the board units under no good condition can dispose.

What is claimed is:

1. A board assembly, comprising:
   a rigid board with a vertical wiring area, a first horizontal wiring area, and a step for electrical connection, the vertical wiring area being separated from the first horizontal wiring area; and
   a flexible board with a second horizontal wiring area mechanically and electrically connected with said rigid board at a top surface of said step through a connection between said vertical wiring area and said second horizontal wiring area, said flexible board having at least one main surface entirely exposed and separated from said rigid board.

2. The board assembly according to claim 1,
   wherein said flexible board is connected with said rigid board only at said step so that said flexible board connection does not exist at any area except said step.

3. The board assembly according to claim 1,
   wherein a connector is formed so as to be exposed from the top surface of said step so that said rigid board is electrically connected with said flexible board by the connection between said connector of said rigid board and another connector of said flexible board.

4. The board assembly according to claim 3,
   wherein said connector of said rigid board is electrically connected to a horizontal wiring area of a rigid connector which is positioned below said connector via a plated metal layer and/or a hardened conductive paste.

5. The board assembly according to claim 3,
   wherein said connector of said flexible board is made of a metal wiring, plated metal layer and/or hardened conductive paste.

6. The board assembly according to claim 3,
   wherein said connector of said rigid board is electrically connected with said connector of said flexible board through the pressure bonding of a conductive paste, an anisotropic conductive film, a high temperature solder, plated Au films which are formed on both connectors, or a bump made of a hardened conductive material or a conductive metal.

7. A method for manufacturing a board assembly wherein a rigid board and a flexible board are connected with one another, comprising the steps of:
   forming said rigid board with a vertical wiring area, a first horizontal wiring area, and a step, the vertical wiring area being separated from the first horizontal wiring area;
   forming said flexible board with a second horizontal wiring area; and
   mechanically and electrically connecting said vertical wiring area of said rigid board with said second horizontal wiring area of said flexible board at a top surface of said step, said flexible board having at least one main surface entirely exposed and separated from said rigid board.

8. The manufacturing method according to claim 7,
   wherein said step of forming said rigid board with said step includes:
   a first step of preparing a first rigid board wherein a connector, which is connected to a horizontal wiring area, is exposed to said step; and
   a second step of adhering a second board with a depressed portion formed commensurate with said step to said first rigid board.

9. The manufacturing method according to claim 7,
   wherein said step of forming said rigid board with said step includes:
   a first step of forming said rigid board with a vertical wiring area connected with a horizontal wiring area at a position level equal to or lower than a connecting position level of said flexible board in an area of said rigid board where said flexible board is connected; and
   a second step of forming a step in said area of said rigid board where said flexible board is connected through spot facing process so that said vertical wiring area is exposed.

10. The manufacturing method according to claim 7,
    wherein a depth of said step of said rigid board is equal to or larger than the thickness of said flexible board to be connected.

11. The manufacturing method according to claim 7,
    wherein said connector of said flexible board is a conductive bump.

12. The manufacturing method according to claim 7,
    wherein said connector of said rigid board is electrically connected with said connector of said flexible board by, between said flexible board and said step of said rigid board, forming a thermal melting insulating layer with a through hole filled with conductive material, said through hole being formed corresponding to a connector of said flexible board so that said connector of said flexible board, said conductive material and said connector formed at said step are overlapped with one another, and thermally pressing said insulating layer.

13. The manufacturing method according to claim 7, wherein said connector of said rigid board is electrically connected with said connector of said flexible board by forming an anisotropy conductive film between said connector at said step of said rigid board and said connector of said flexible board.

14. The manufacturing method according to claim 7, wherein said connector of said rigid board is electrically connected with said connector of said flexible board by forming a solder connection on said flexible board so as to form a given pattern commensurate with said connector of said flexible board, and heating said solder under the condition that said solder is contacted with said connector of said step of said rigid board.

15. The manufacturing method according to claim 7, wherein said connector of said rigid board is electrically connected with said connector of said flexible board by plating Au films on said connectors of said rigid board and said flexible board, and pressing said plated Au films.

16. The manufacturing method according to claim 11, wherein at the connection between said flexible board and said rigid board, a thermal melting insulating layer is formed so as to cover a horizontal wiring area of said flexible board and a conductive bump contacted with said horizontal wiring area is penetrated through said insulating layer and exposed, and the connection between said rigid board and said flexible board is carried out through thermal pressing under the condition that said connector of said rigid board is contacted with said connector of said flexible board.

* * * * *